(12) United States Patent
Terao

(10) Patent No.: US 7,366,263 B2
(45) Date of Patent: Apr. 29, 2008

(54) RADIO COMMUNICATION TERMINAL AND RADIO SIGNAL RECEIVING METHOD

(75) Inventor: Kenji Terao, Tokyo (JP)

(73) Assignee: NEC Corporation, Tokyo (JP)

( * ) Notice: Subject to any disclaimer, the term of this patent is extended or adjusted under 35 U.S.C. 154(b) by 705 days.

(21) Appl. No.: 10/829,172

(22) Filed: Apr. 22, 2004

(65) Prior Publication Data

US 2004/0214529 A1 Oct. 28, 2004

(30) Foreign Application Priority Data

Apr. 28, 2003 (JP) ............................. 2003-123408

(51) Int. Cl.
*H04L 27/08* (2006.01)
(52) U.S. Cl. ...................... 375/345; 375/267; 375/347; 455/67.11; 455/135; 455/234.1; 455/245.1; 455/277.1
(58) Field of Classification Search ................ 375/267, 375/345, 347; 455/67.11, 133–136, 232.1, 455/233.1, 234.1, 240.1, 245.1, 277.1, 277.2
See application file for complete search history.

(56) References Cited

U.S. PATENT DOCUMENTS

| 6,154,503 | A | * | 11/2000 | Strolle | 375/264 |
|---|---|---|---|---|---|
| 6,226,507 | B1 | * | 5/2001 | Ramesh et al. | 455/277.1 |
| 6,292,019 | B1 | * | 9/2001 | New et al. | 326/41 |
| 6,330,433 | B1 | * | 12/2001 | Jager | 455/277.2 |
| 7,171,175 | B2 | * | 1/2007 | Lahti et al. | 455/135 |
| 2002/0071507 | A1 | | 6/2002 | Hasegawa | |
| 2002/0118780 | A1 | | 8/2002 | Hurley et al. | |

FOREIGN PATENT DOCUMENTS

| EP | 0 886 388 A2 | 12/1998 |
|---|---|---|
| EP | 1 065 805 A2 | 1/2001 |
| JP | 2002-135346 | 5/2002 |
| WO | WO 95/09494 | 4/1995 |
| WO | WO 01/52429 | 7/2001 |

* cited by examiner

*Primary Examiner*—Dac V. Ha
(74) *Attorney, Agent, or Firm*—Foley & Lardner LLP

(57) ABSTRACT

When a radio communication terminal including an AGC receiver starts, a set gain of the AGC receiver is switched in a short updating period. At this time, the terminal switches among antennas, and calculates and stores a received power of a received radio signal through each antennal. This calculation is performed a predetermined number of times for each antenna. After that, the terminal compares the calculated received powers of the radio signal through each antenna, and fixedly uses, as a receiving antenna, one of the antennas which receives a signal with the largest power.

18 Claims, 3 Drawing Sheets

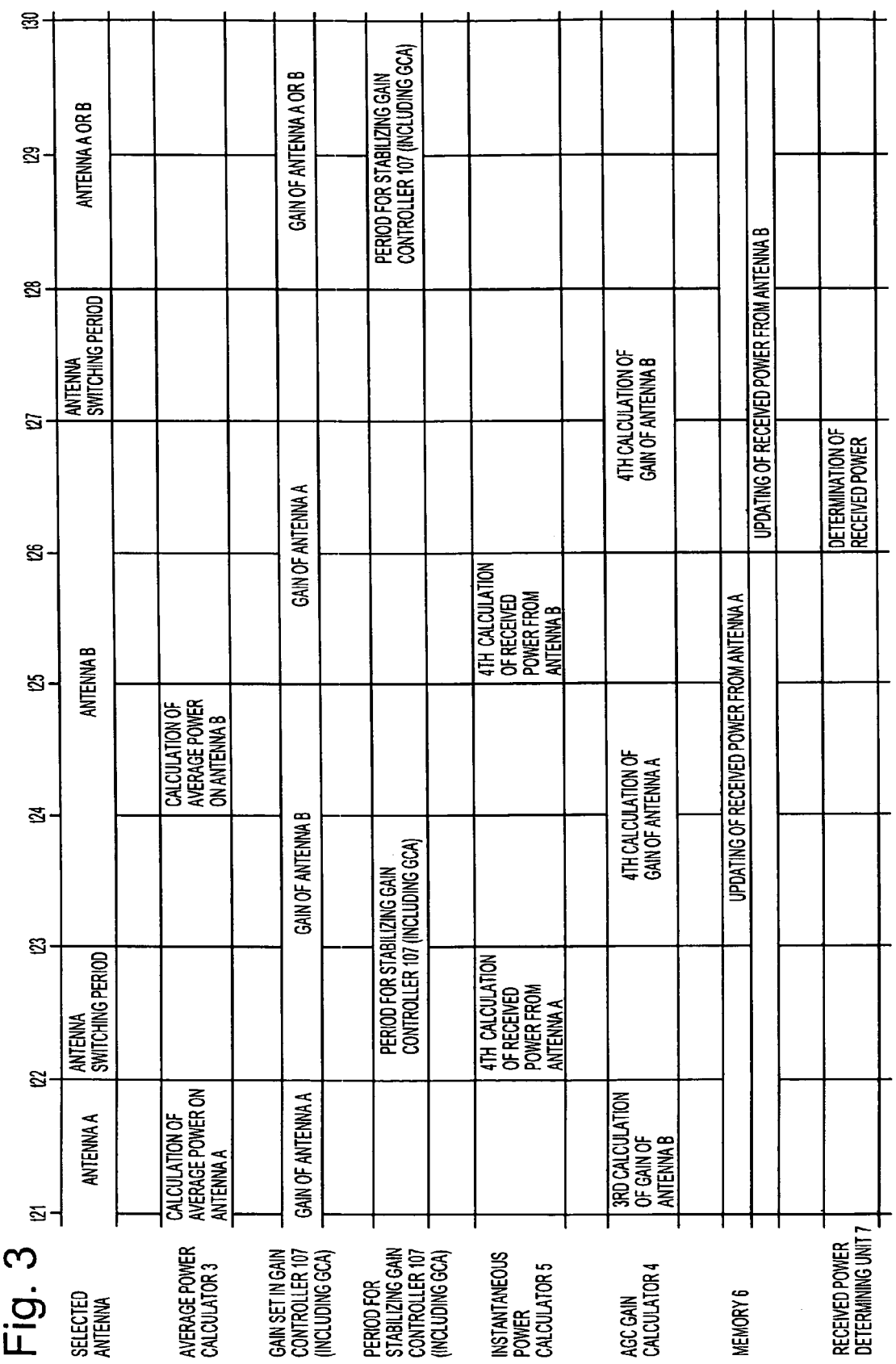

RADIO COMMUNICATION TERMINAL AND RADIO SIGNAL RECEIVING METHOD

BACKGROUND OF THE INVENTION

1. Field of the Invention

The present invention relates to radio communication terminals and receiving methods, and particularly to a radio communication terminal with automatic gain control (AGC) and to an antenna switching method.

2. Description of the Related Art

In a Wideband Code Division Multiple Access (W-CDMA) system of the related art, a radio communication terminal has a plurality of antennas for RX(Receiving) diversity communications. In the radio communication terminal, in order to improve receiving signal quality, the radio signals received through the antennas are combined with one another so that an optimal gain can be obtained. The radio communication terminal is small. Accordingly, it is difficult to provide a complicated circuit for executing the above operation in the radio communication terminal. Radio communication environments of the terminal are not constant since the radio communication terminal always moves with its user. Therefore, the radio communication terminal needs more complicated receiving processes.

In addition, a receiving method that provides simple antenna switching procedure. Switching of the antennas is made based on the received signal power. An AGC receiver in the radio communication terminal measures the received power intensity. The AGC receiver amplifies a received radio signal by feedback-controlling. For example, Japanese Unexamined Patent Application Publication No. 2002-135346 discloses an AGC circuit that calculates the power of an input signal during a short period. This AGC circuit makes it possible to obtain a targeted reception level at high speed in the beginning of operation. However, an AGC technology of the related art has a possibility that an unstable received radio signal caused by antenna switching may be used as received data.

SUMMARY OF THE INVENTION

According to an aspect of the present invention, a radio communication terminal is provided which includes a plurality of antennas, an antenna switching unit for switching an antenna to another, a receiver for amplifying a received signal under automatic gain control, a power calculator for calculating received signal power, a memory for storing the calculated power values, and a power determining unit for selecting an antenna which receives the largest signal power. And the received signal is received during a high speed operation when the receiver starts.

Preferably, the radio communication terminal further includes a gain calculator for calculating a gain based on an output from the receiver. The gain calculator may output the gain to the power calculator and the gain controller.

According to another aspect of the present invention, a radio signal receiving method is provided which includes the steps of: receiving a radio signal through one antenna among a plurality of antennas by a receiver operating under automatic gain control; calculating the power of the received radio signal based on a gain and output of the receiver; switching the one antenna to another among the plurality of antennas; storing the calculated power for each of the antennas in a memory; calculating a gain based on the output of the receiver and setting the calculated gain in the receiver; and selecting, from the plurality of antennas, one antenna from which the largest power is obtained.

According to the present invention, an unstable received radio signal caused by antenna switching is not used as received data.

BRIEF DESCRIPTION OF THE DRAWINGS

The above and other objects, features, and advantages of the present invention will become apparent from the following detailed description when taken with the accompanying drawings in which:

FIG. 3 is a time chart showing an example of a process in which the radio communication terminal shown in FIG. 1 shifts to an AGC operation.

DESCRIPTION OF THE PREFERRED EMBODIMENTS

Figure 1:
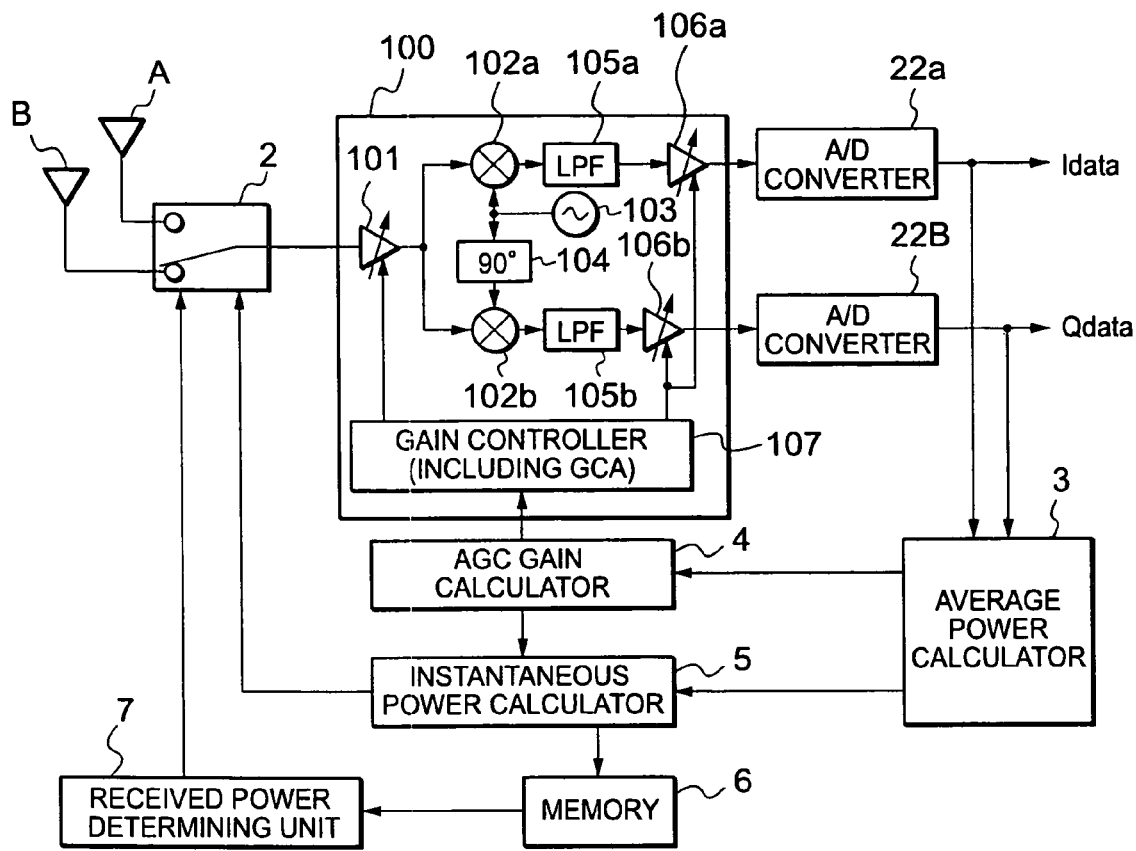
FIG. 1 is a block diagram showing a radio communication terminal according to an embodiment of the present invention.

Referring to FIG. 1, an example of a Direct Spread Code Division Multiple Access (DS-CDMA) radio communication terminal is shown as a radio communication terminal according to an embodiment of the present invention. The radio communication terminal includes antennas A and B, an antenna switching unit 2, and a direct conversion receiver 100, which is an AGC radio receiver. The radio communication terminal also includes an average power calculator 3, an AGC gain calculator 4, an instantaneous power calculator 5, a memory 6, and a received power determining unit 7. The direct conversion receiver 100 has analog-to-digital (A/D) converters 22a and 22b at its output side.

The antennas A and B receive radio signals. Under the control of one of the instantaneous power calculator 5 or the received power determining unit 7, the antenna switching unit 2 selects one of the antennas A and B. The direct conversion receiver 100 receives the radio signal received through the selected antenna. The receiver 100 is an AGC receiver employing direct conversion method. The receiver 100 directly converts a carrier wave frequency into a baseband frequency. Accordingly, the receiver 100 does not need an intermediate frequency (IF) filter. The receiver 100 has a built-in gain controller 107. When the radio communication terminal starts receiving signals, the receiver 100 sets the gain controller 107 in a very short updating period. In this embodiment, the gain controller 107 includes a gain control amplifier (GCA). It takes a relatively long time for the GCA to stabilize.

The direct conversion receiver 100 includes, the gain controller 107 (including the GCA), a high frequency amplifier 101, orthogonal mixers 102a and 102b, and a local oscillator 103. The receiver 100 also includes a 90-degree phase shifter 104, low-pass filters (LPFs) 105a and 105b, and band-pass amplifiers 106a and 106b. The gain controller 107 (including the GCA) controls the above three amplifiers 101, 106a, and 106b. The amplifiers 101, 106a, and 106b amplify the received signal at the set gain. The orthogonal mixers 102a and 102b each orthogonally transform the received signal to an I component signal and a Q component signal. The A/D converters 22a and 22b respectively convert the I signal and the Q signal output from the receiver 100 from analog to digital form.

The average power calculator 3 calculates the average power of the I signal and Q signal converted in digital form. The average power is output to the AGC gain calculator 4 and the instantaneous power calculator 5. The AGC gain calculator 4 calculates a gain based on the average power, and outputs the calculated gain to the gain controller 107 (including the GCA) and the instantaneous power calculator 5. The AGC gain calculator 4 has a function of retaining the gain until it is required. Based on the average power and the reciprocal of the gain output from the AGC gain calculator 4, the instantaneous power calculator 5 calculates an instantaneous received power of the received radio signal. The memory 6 stores the calculated received power. At this time, when the memory 6 stores a received power of a radio signal received through the same antenna, the calculated power is added to the stored received power, and the obtained received power is stored. The memory 6 stores received powers of the received radio signal for each antenna. The received power determining unit 7 compares the received powers of the received radio signal which are stored in the memory 6. The unit 7 controls the antenna switching unit 2 to select an antennal from which receives a signal with a larger received power. When the instantaneous power calculator 5 calculates the instantaneous received power a number of times, the unit 7 compares the averages of the received powers. The above radio communication terminal can be, for example, a cellular phone.

Figure 2:
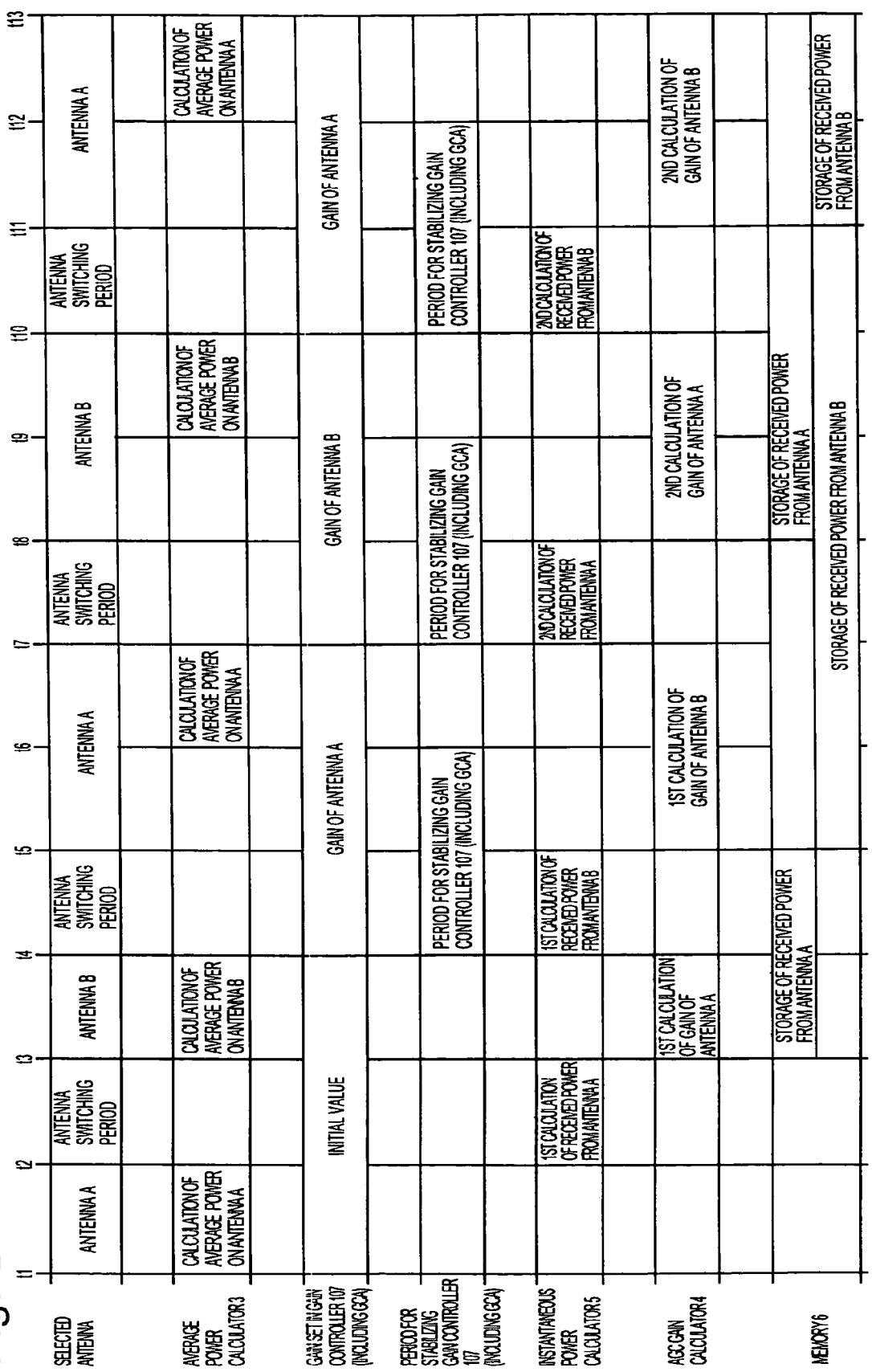
FIG. 2 is a time chart showing an example of a receiving operation of the radio communication terminal shown in FIG. 1 when it is started.

FIG. 2 shows an example of an operation of the above radio communication terminal. In this example, when the radio communication terminal starts, in the gain controller 107 (including the GCA), updating of the period of the set gain is performed at high speed. In this high speed operation, a consecutive operation (described later) is performed four times for each antenna. At the end of the high speed operation, the radio communication terminal selects either antenna A or B. After that, the high speed operation is switched to an usual AGC operation. In the usual AGC operation, switching of the antennas A and B is not performed.

Referring to FIG. 2, the radio communication terminal starts at time t1. At this time, the antenna switching unit 2 has selected the antenna A beforehand. The direct conversion receiver 100 receives the radio signal received through the antenna A.

At time t1, the gain controller 107 (including the GCA) has a predetermined gain beforehand. The direct conversion receiver 100 amplifies the radio signal received through the antenna A at the above gain. The A/D converters 22a and 22b convert amplified signals from analog form to digital form. The average power calculator 3 calculates an average received power of the digitized signals. Since the gain controller 107 (including the GCA) has the predetermined gain beforehand, the gain controller 107 (including the GCA) is stable in a period (just after the radio communication terminal starts) from time t1 to time t4. Therefore, the average power calculator 3 can calculate an average received power in an arbitrary period (t1 to t2, or t3 to t4).

At time t2, the average power calculator 3 outputs the average received power to the AGC gain calculator 4 and the instantaneous power calculator 5. When receiving the average received power of the radio signal received through the antenna A, the instantaneous power calculator 5 selects the antenna B by transmitting a control signal to the antenna switching unit 2. Switching to the antenna B is completed at time t3. At time t2, the instantaneous power 10 calculator 5 obtains an instantaneous received power from the antenna A by dividing the average received power of the radio signal received through the antenna A by the gain set in the AGC gain calculator 4.

At time t3, the instantaneous power calculator 5 stores the calculated power in the memory 6. When the memory 6 has already stored a received power from the antenna A, the calculated instantaneous received power is added to the stored received power, and the obtained power is stored. At time t3, the AGC gain calculator 4 calculates a gain (to be set in the gain controller 107 (including the GCA)) based on the difference between the present average received power of the radio signal received through the antenna A and the targeted value. At the time (time t4) the average power calculator 3 completes calculating the next average received power, the AGC gain calculator 4 outputs the calculated gain to the gain controller 107 (including the GCA) and the instantaneous power calculator 5. The AGC gain calculator 4 retains the calculated gain until time t4.

At time t3, the antenna B starts to receive a radio signal. At time t3, the gain controller 107 (including the GCA) has a predetermined gain. Accordingly, the radio signal received through antenna B is amplified with that gain. The average power calculator 3 calculates an average received power between time t3 and time t4, and outputs the calculated average received power to the AGC gain calculator 4 and the instantaneous power calculator 5 at time t4.

At time t4, when receiving the average received power of the signal received through the antenna B, the instantaneous power calculator 5 selects the antenna A by transmitting a control signal to the antenna switching unit 2. Switching to the antenna A is completed at time t5. At time t4, the instantaneous power calculator 5 obtains an instantaneous received power from the antenna B by dividing the average received power of the signal received through the antenna B by the gain transmitted from the AGC gain calculator 4.

At time t5, the instantaneous power calculator 5 stores the received power of the radio signal received through the antenna B. At this time, when the memory 6 has already stored a received power of the radio signal received through the antenna B, the calculated received power is added to the stored received power, and the obtained received power is stored. The instantaneous power calculator 5 stores the instantaneous received power for each of the antennas in the memory 6.

At time t5, the AGC gain calculator 4 calculates a gain (to be set in the gain controller 107 (including the GCA)) based on the difference between the present average received power of the radio signal received through the antenna B and the targeted value. At the time (time t7) the average power calculator 3 completes calculating the next average received power, the AGC gain calculator 4 outputs the calculated gain to the gain controller 107 (including the GCA) and the instantaneous power calculator 5. The AGC gain calculator 4 retains the calculated gain until time t7.

A period (e.g., time t6 to time t7) in which the average power calculator 3 calculates the average power is within the period (e.g., time t6 to time t7) for updating the set gain in the gain controller 107 (including the GCA) and after the gain controller 107 (including the GCA) stabilizes. In this embodiment, the above operation is executed four times for each antenna. After that, the operation shown in FIG. 3 starts.

FIG. 3 shows an example of an operation which is executed in a period in which the high speed operation shifts to the normal AGC operation. At time t23, the memory 6 stores the (fourth) received power of the radio signal received through the antenna A which is calculated by the instantaneous power calculator 5. At time t26, the memory 6 stores the (fourth) received power of the radio signal received through the antenna B which is calculated by the instantaneous power calculator 5. At time t27, the received power determining unit 7 compares the average (or total) instantaneous received powers obtained through the antennas A and B which are stored in the memory 6. At time t27, by transmitting a control signal to the antenna switching unit 2, the received power determining unit 7 selects one antenna from which a larger received power is obtained. At time t28, radio signal reception through the selected antenna is initiated. This receiving operation is a normal AGC operation without switching between the antennas A and B. Also, after that, the high speed operation can be maintained. In this case, the high speed operation can be shifted to the normal AGC operation.

During the high speed operation, which is executed when the radio communication terminal starts, processing, such as encoding of a received radio signal, is not performed. Therefore, the received radio signal is not used as received data.

In the present invention, during the high speed operation when the radio communication terminal starts, selection and setting of an antenna from which the largest received power is obtained are performed. Thus, in an AGC operation after the high speed operation, an unstable received radio signal caused by antenna switching is not used as received data.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the sprit and scope of the following claims.

What is claimed is:

1. A radio communication terminal comprising:
   a plurality of antennas;
   an antenna switching unit for switching an antenna to another;
   a receiver for amplifying a received signal under automatic gain control;
   a power calculator for calculating received signal power based on a gain and output of said receiver;
   a memory for storing the calculated power values; and
   a power determining unit for selecting an antenna which receives the largest signal power; and
   wherein the received signal is received during a high speed operation when the receiver starts.

2. The radio communication terminal according to claim 1, further comprising a gain calculator for calculating a gain based on an output from the receiver.

3. The radio communication terminal according to claim 2, further comprising a gain controller,
   wherein the gain calculator outputs the gain to the power calculator and the gain controller.

4. The radio communication terminal according to claim 2, further comprising an average power calculator for calculating an average power of a plurality of signals output from the receiver.

5. The radio communication terminal according to claim 4, wherein the average power calculator outputs the average power to the gain calculator and the power calculator.

6. The radio communication terminal according to claim 1, wherein a power control unit controls the antenna switching unit to switch the antenna.

7. The radio communication terminal according to claim 1, wherein the power determining unit compares the power values stored in the memory for each of the antennas.

8. The radio communication terminal according to claim 1, wherein, based on a gain and output of the receiver, the power calculator calculates the power of a signal received through each of the antennas.

9. The radio communication terminal according to claim 1, wherein the receiver employs direct conversion method.

10. A radio signal receiving method comprising the steps of:
    receiving a radio signal through one of a plurality of antennas by a receiver operating under automatic gain control;
    calculating the power of the received radio signal based on a gain and output of said receiver;
    switching the antenna to another;
    storing the calculated power for each of the antennas in a memory;
    calculating a gain based on the output of said receiver and setting the calculated gain in said receiver; and
    selecting an antenna which receives an signal with the largest power.

11. The radio signal receiving method according to claim 10, further comprising a step of calculating an average power of a plurality of signals output from the receiver.

12. The radio signal receiving method according to claim 11, wherein calculation of the average power is performed within a period in which a predetermined gain is retained in the receiver and after the receiver stabilizes.

13. The radio signal receiving method according to claim 11, wherein, when calculation of the average power is initially executed, the calculation is performed within a period in which a predetermined gain is retained in the receiver.

14. The radio signal receiving method according to claim 11, wherein setting of the calculated gain in the receiver is performed after calculation of the next average power ends.

15. The radio signal receiving method according to claim 11, wherein switching of an antenna to another is performed after calculation of the average power ends.

16. The radio signal receiving method according to claim 10, wherein each of the steps is executed during a high speed operation of said receiver when said receiver starts.

17. The radio signal receiving method according to claim 10, wherein the power of the radio signal is calculated a number of times for each of the antennas.

18. The radio signal receiving method according to claim 17, wherein the calculated powers are added up.

* * * * *